United States Patent
Dresler et al.

(10) Patent No.: US 10,409,698 B2
(45) Date of Patent: Sep. 10, 2019

(54) METHOD AND AUTOMATIC TEST EQUIPMENT FOR PERFORMING A PLURALITY OF TESTS OF A DEVICE UNDER TEST

(75) Inventors: Martin Dresler, Oberstdorf (DE); Johannes Hauf, Stuttgart (DE); Martin Schmitz, Herrenberg (DE)

(73) Assignee: ADVANTEST CORPORATION, Tokyo (JP)

( * ) Notice: Subject to any disclaimer, the term of this patent is extended or adjusted under 35 U.S.C. 154(b) by 1106 days.

(21) Appl. No.: 13/640,282

(22) PCT Filed: Apr. 8, 2011

(86) PCT No.: PCT/EP2011/055507
§ 371 (c)(1),
(2), (4) Date: Jan. 31, 2013

(87) PCT Pub. No.: WO2011/124681
PCT Pub. Date: Oct. 13, 2011

(65) Prior Publication Data
US 2013/0211770 A1    Aug. 15, 2013

Related U.S. Application Data

(60) Provisional application No. 61/342,172, filed on Apr. 9, 2010.

(51) Int. Cl.
*G06F 11/26* (2006.01)
*G01R 31/319* (2006.01)

(52) U.S. Cl.
CPC ........ *G06F 11/26* (2013.01); *G01R 31/31907* (2013.01)

(58) Field of Classification Search
None
See application file for complete search history.

(56) References Cited

U.S. PATENT DOCUMENTS

| | | | | |
|---|---|---|---|---|
| 5,479,413 A * | 12/1995 | Sicola | ................. | G11C 29/02 714/718 |
| 5,720,032 A * | 2/1998 | Picazo, Jr. | ............... | H04L 12/44 370/351 |
| 6,105,145 A * | 8/2000 | Morgan | .................... | G06F 1/08 713/501 |
| 6,643,803 B1 * | 11/2003 | Swoboda | ............ | G06F 11/3656 714/29 |
| 6,732,053 B1 * | 5/2004 | Aragona | ............ | G01R 31/2834 702/108 |

(Continued)

FOREIGN PATENT DOCUMENTS

EP        0943996 A2 *  9/1999   .......... G06F 11/3648

*Primary Examiner* — Gregory J Toatley, Jr.
*Assistant Examiner* — Brandon J Becker

(57) ABSTRACT

A method for performing a plurality of tests on a device under test comprises performing a plurality of tests on a device under test. Each test of the plurality of tests comprises a foreground process and a background process. The foreground process comprises a setup process during which a desired test mode is set. The background process comprises an upload process during which data captured from the device under test is provided. The foreground process is executed with a higher priority than the background process, thereby minimizing a delay between a start of consecutive tests of the device under test.

24 Claims, 8 Drawing Sheets

(56) References Cited

U.S. PATENT DOCUMENTS

| | | | |
|---|---|---|---|
| 2005/0076266 A1* | 4/2005 | Costin | G06F 11/1415 714/38.13 |
| 2006/0087402 A1* | 4/2006 | Manning | G05B 19/41875 340/3.1 |
| 2006/0132161 A1* | 6/2006 | Khandros | G01R 31/2884 324/762.05 |
| 2007/0282999 A1* | 12/2007 | Tu | G06F 11/26 709/224 |
| 2007/0294579 A1* | 12/2007 | Fay | G06F 11/26 714/30 |
| 2008/0077953 A1* | 3/2008 | Fernandez | H04N 7/15 725/32 |
| 2008/0104613 A1* | 5/2008 | Ciszkowski | H04L 43/10 719/318 |
| 2010/0205541 A1* | 8/2010 | Rapaport | G06Q 10/10 715/753 |
| 2011/0099424 A1* | 4/2011 | Rivera Trevino | G06F 11/263 714/25 |

* cited by examiner

```
Test_1()
{
  {
    SETUP_TESTER()          ⎫
    SETUP_DUT()             ⎬ foreground process -
                            ⎪    high priority
    CAPTURE_DUT_OUTPUT()    ⎭

Call BACKGROUND_THREAD_TEST_1()
  }

BACKGROUND_THREAD_TEST_1()
  {
    UPLOAD_CAPTURED_DUT_OUTPUT()   ⎫
    CALCULATE_RESULT()             ⎪
                                   ⎬ background process -
    JUDGE_BUFFER_RESULT_AGAINST_   ⎪    low priority
    DUT_SPECIFICATION()            ⎭
  }
}
```

FIGURE 5B

Serial Test Approach

| test 1 | test 2 | test 3 |
|---|---|---|
| setup | | |
| capture | | |
| capture | | |
| upload | | |
| upload | | |
| calculation | | |
| calculation | | |
| judge | | |
| | setup | |
| | capture | |
| | upload | |
| | calculation | |
| | judge | |
| | | setup |
| | | capture |
| | | capture |
| | | upload |
| | | upload |
| | | calculation |
| | | judge |

FIGURE 6A

METHOD AND AUTOMATIC TEST EQUIPMENT FOR PERFORMING A PLURALITY OF TESTS OF A DEVICE UNDER TEST

CROSS-REFERENCES TO RELATED APPLICATIONS

This application is a Continuation of and claims priority to International Application No. PCT/EP2011/055507, filed on Apr. 8, 2011, titled "METHOD AND AUTOMATIC TEST EQUIPMENT FOR PERFORMING A PLURALITY OF TESTS OF A DEVICE UNDER TEST," by Dresler et al., which claims the benefit of U.S. Provisional Application No. 61/342,172, filed on Apr. 9, 2010, which are herein incorporated by reference.

TECHNICAL FIELD

The present disclosure relates generally to the field of test performance by devices under test and more specifically to the field of automated test equipment performing tests on devices under test.

BACKGROUND

Automatic or automated test equipment (ATE) are required to perform a variety of electrical tests to ensure the functionality of a device under test (DUT) according to its device specifications. For analog devices like analog-to-digital converters (ADC) or radio frequency (RF) devices like mobile phone transceivers, each test may consist of 5 basic processes: setup, capture, upload, calculate, and judgment. During a setup process, the ATE and a connected DUT may be set into a requested test mode. During a capture process, a DUT output is captured by an ATE measurement instrument. During an upload process, the captured data will be uploaded to a post-processing unit. During the calculate process, the results will be calculated in the post-processing unit. Finally, during a judge or judgment process, it will be determined whether the calculated result is within DUT specifications.

FIG. 3 illustrates a plurality of tests performed on a DUT sequentially. For each test respective processes, procedures, or processes are indicated. A communication link (CL) between ATE measurement units and an ATE post-processing unit may be a shared resource: The communication link is used to setup measurement instruments as well as to read back capture results. When the communications link is being used by a currently running test, another test that is ready to run must wait until the DUT output of the previous test is uploaded.

Commonly known systems may use one of two concepts: an ATE may perform the upload and calculation in a serial fashion as illustrated in FIG. 1, or the ATE may use separate dedicated calculation digital signal processing (DSP) units which may necessitate additional hardware links and link management, as illustrated in FIG. 2.

SUMMARY OF THE INVENTION

Embodiments of this present invention provide a solution to the challenges inherent in managing the performance of a plurality of tests on a DUT. In a method according to one embodiment of the present invention, a method for performing a plurality of tests on a device under test is disclosed. Each test comprises a foreground process comprising a setup process during which a desired test mode is set, and a background process comprising an upload process during which data captured from the device under test is provided, wherein the foreground process is executed with a higher priority than the background process, thereby minimizing a delay between the start of consecutive tests of the device under test.

In a test system according to one embodiment of the present invention, the test system may comprise a computer readable medium comprising program code for executing a method for performing a plurality of tests of a device under test when the program code is run on a computer, wherein each test comprises a foreground process comprising a setup process during which a desired test mode is set, and a background process comprising an upload process during which data captured from the device under test is provided, and wherein the foreground process is executed with a higher priority than the background process, thereby minimizing a delay between the start of consecutive tests of the device under test.

In an automatic test apparatus according to one embodiment of the present invention, an automatic test equipment is operable to perform a plurality of tests of a device under test may have: one or more measurement units; a post-processing unit; a communication link connecting the one or more measurement units and the post-processing unit; and a control unit; wherein each test comprises a foreground process comprising a setup process during which a desired test mode is set, and a background process comprising an upload process during which data captured from the device under test is provided, wherein the communication link is shared by the foreground process and the background process, and wherein the control unit is configured to execute the foreground process with a higher priority than the background process, thereby minimizing a delay between the start of consecutive tests of the device under test.

In a method according to one embodiment of the present invention, a method for performing a plurality of tests on a device under test is disclosed. Each test comprises a foreground process comprising a setup process during which a desired test mode is set, and a background process comprising an upload process during which data captured from the device under test is provided. The foreground process is executed with a higher priority than the background process, thereby minimizing a delay between the start of consecutive tests of the device under test.

According to further embodiments, a capture process may be provided in the foreground process (e.g. after the setup process), during which data from the device under test is captured. According to further embodiments, a calculate process may be provided in the background process (e.g. after the upload process) for calculating a result of the test based on the data uploaded.

Further embodiments of the invention relate to an automatic test equipment for performing a plurality of tests of a device under test, including one or more measurement units; a post-processing unit; a communication link connecting the one or more measurement units and the post-processing unit; and a control unit; wherein each test comprises a foreground process comprising a setup process during which a desired test mode is set, and a background process comprising an upload process during which data captured from the device under test is provided, wherein the communication link is shared by the foreground process and the background process, and wherein the control unit is configured to execute the foreground process with a higher priority than the background process, thereby minimizing a delay between the start of consecutive tests of the device under test.

In automated test equipment (ATE) according to one embodiment of the present invention, test throughput of an ATE may be improved when the test performed by the ATE comprises a foreground process and a background process which share a same communication link and which have different priorities. Compared to systems in which the tests are not split into foreground and background processes, the start of consecutive tests can be reduced, for example, by running a first test and starting a second test with its foreground process while the first test still runs its background process. The shared resource (the communication link) can be used by the background process of the first test and the foreground process of the second test. Due to the higher priority of the foreground process of the second test, the background process of the first test may use the communication link only when it is not blocked by the foreground process of the second test. It has been found that a process (e.g. a setup process) of a test does not need the shared resource throughout the complete process, but only at certain times during the process. Hence, during the process of the foreground process of the second test there may be periods in which the process does not need the communication link. During these periods the background process of the first test may use the communication link. Hence, the second test does not have to wait until the first test is finished. As an example, the second test can be started when the first test finishes its foreground process and starts its background process.

Hence, exemplary embodiments of the present invention enable a higher throughput of tests by splitting the tests into foreground processes and background processes (the foreground and background processes having different priorities), such that several tests can run in parallel. As an example, a first test of a plurality of tests running in parallel may run its foreground process, while one or more other tests of the plurality of tests running in parallel run a background process with a lower priority than the foreground process of the first test.

BRIEF DESCRIPTION OF THE DRAWINGS

Embodiments of the present invention will be better understood from the following detailed description, taken in conjunction with the accompanying drawing figures in which like reference characters designate like elements and in which:

FIG. 5B illustrates an exemplary self-contained pseudo code example for a test performed by the automatic test equipment of FIG. 4, in accordance with an embodiment of the present invention;

FIG. 6A illustrates an example of a serial test approach, in accordance with an embodiment of the present invention.

DETAILED DESCRIPTION

Figure 1:
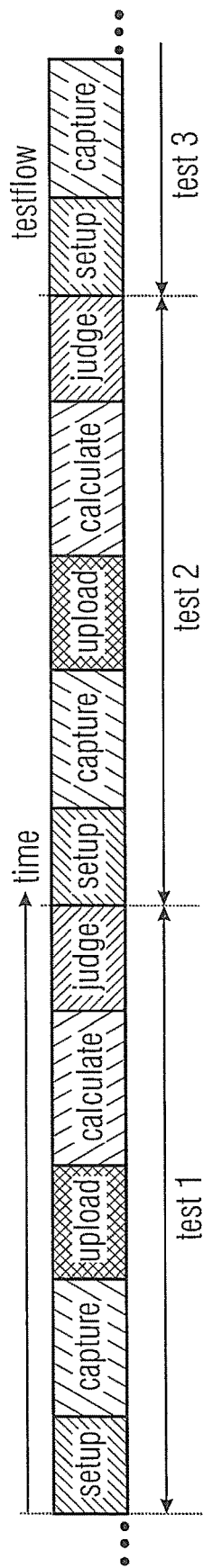
FIG. 1 illustrates an exemplary method for performing a plurality of tests on a device under test sequentially.
Figure 2:
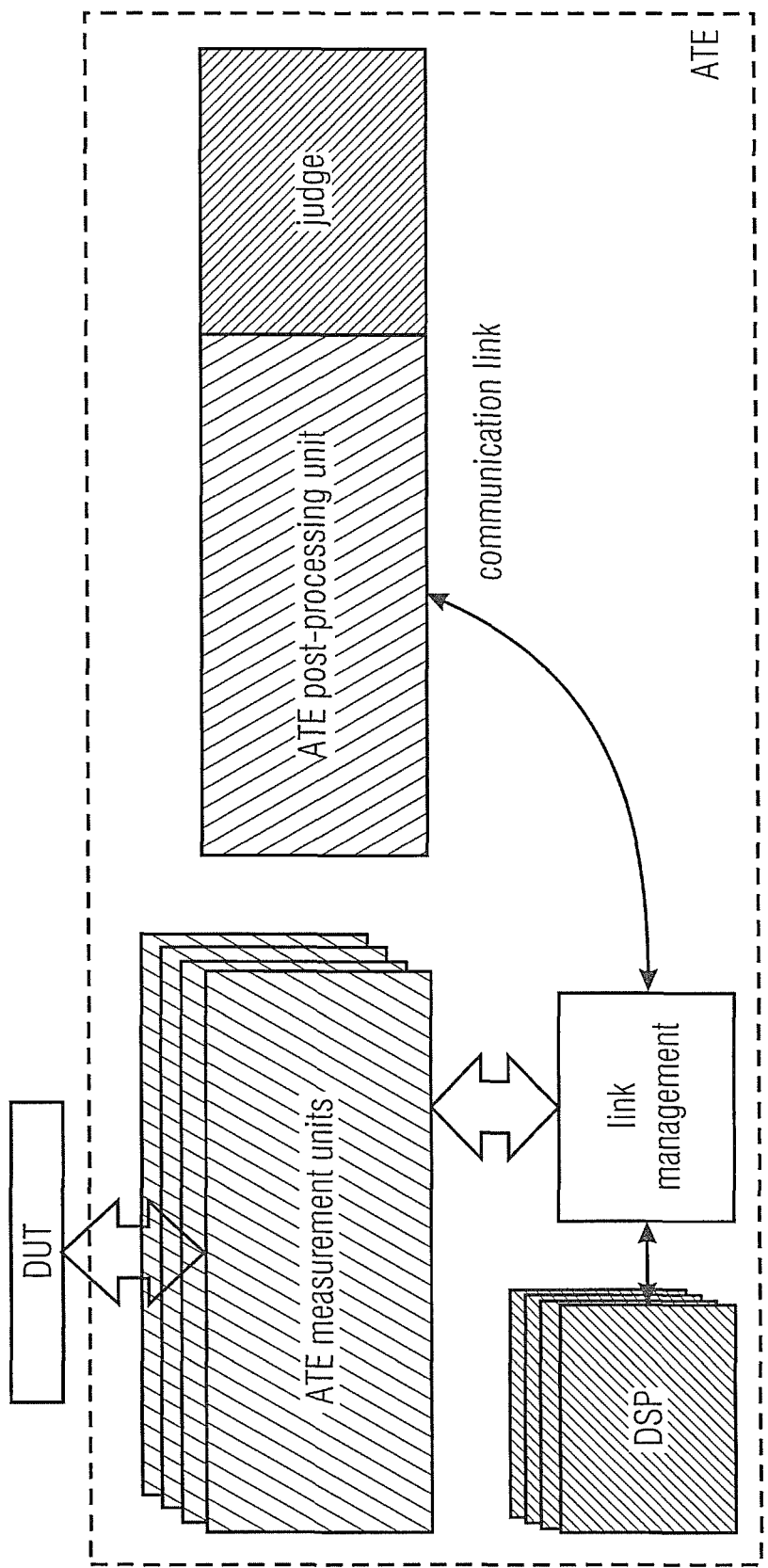
FIG. 2 illustrates an exemplary automatic test equipment using dedicated calculation DSP units.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of the present invention provide a solution to the increasing challenges inherent in coordinating the execution and management of multiple tests on a device under test. Various embodiments of the present invention provide for a test to be split into a foreground process and a background process with each process provided a different priority. As discussed below, a high test-throughput can be combined with a low hardware effort when a test performed on a device under test is split into a foreground process and a background process with different priorities. The foreground process can comprise time critical test steps (e.g., a setup process for setting the desired test mode), while the background process can comprise less time critical test steps (e.g., an upload process of the captured data from the device under test).

By splitting a test into a foreground process and a background process with different priorities, a resource may be shared by both the foreground process and the background process. As discussed herein, the resource will only be used by the background process if the foreground process is not using it. Typically, such a shared resource is not needed during the entire time that a foreground process is running, therefore, there may be times during which the resource is free and can be used by the background process to perform its own procedure, even while the foreground process continues to run. This enables the start of a second test, during which the first test is still active. For example, a second test can be started when the first test performs its background process (e.g., performs the upload procedure). The second test may start with its foreground process (e.g., performing its setup procedure) and therefore may have a higher priority than the background process of the first test. Hence, the background process of the first test may be halted when the foreground process of the second test needs a shared resource, and may be continued when the foreground process does not need the shared resource. A delay between the start of consecutive tests of the device under test can be reduced or minimized, since a second test can be started while the first test is still running. This may dramatically increase test throughput (more tests can be performed in the same period).

Figure 3:
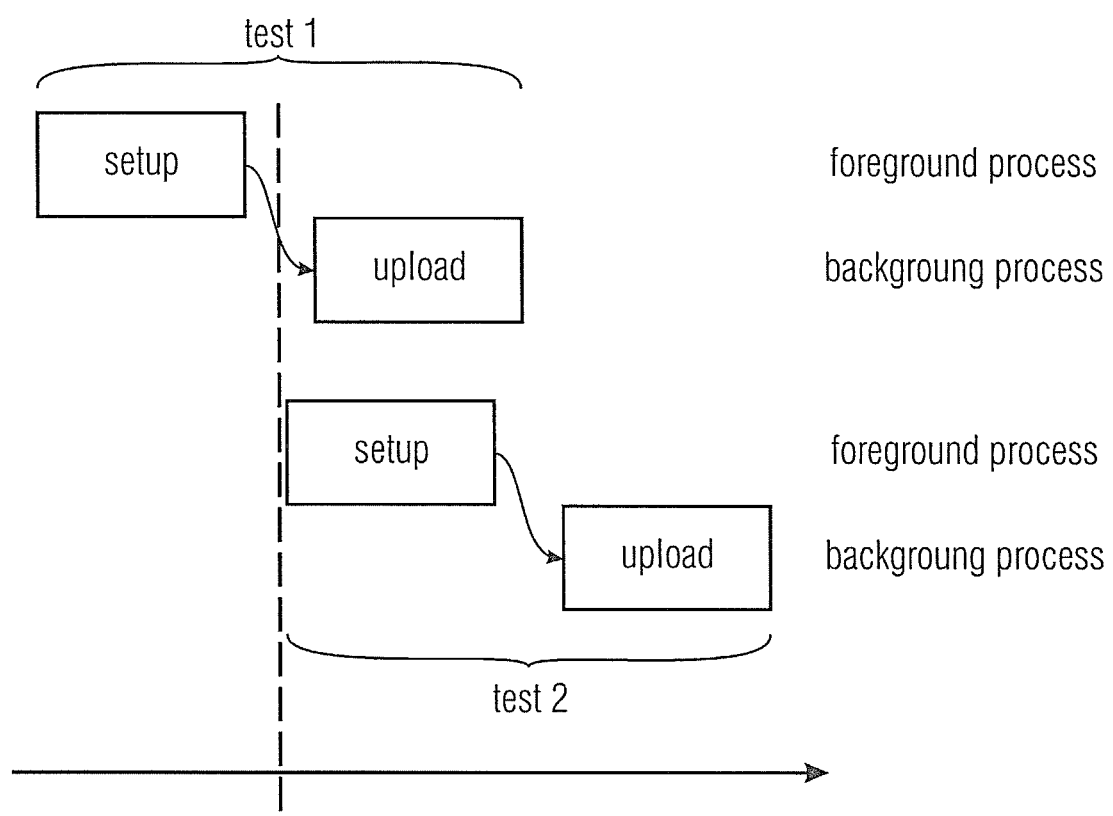
FIG. 3 illustrates an exemplary schematic illustrating the steps to a method in accordance with an embodiment of the present invention.

FIG. 3 illustrates an exemplary method for performing a plurality of tests on a device under test. In this method each test comprises a foreground process comprising a setup procedure during which a desired test mode is set, and a background process comprising an upload procedure during which data captured from the device under test is provided. The foreground process is executed with a higher priority than the background process, thereby minimizing a delay between the start of consecutive tests of the device under test.

FIG. 3 illustrates an exemplary first test, Test 1, comprising a foreground process and a background process. The foreground process comprises a setup step/procedure or process for setting a desired test mode, for example, of the device under test. Furthermore, Test 1 comprises a background process comprising an upload process or procedure during which data captured from the device under test is provided. Typically a setup process/procedure is performed before an upload procedure. Furthermore, FIG. 3 also illustrates an exemplary second test, Test 2, comprising a foreground process, the foreground process comprising a setup procedure. Test 2 also comprises a background process comprising an upload process/procedure. The background processes of the two tests have a lower priority than their associated foreground processes. In other words, a resource that is shared by a foreground process and a background process can be blocked by the foreground process. The background process can use the shared resource (only) when the foreground process does not need the shared resource.

From FIG. 3 it can be seen that Test 2 can be started when Test 1 finishes its foreground process. Hence, Test 1 and Test 2 may share the same shared resource and either Test 1 or Test 2 runs in its foreground process, while the other test may run in its background process. By starting Test 2 when Test 1 finishes its foreground process instead of starting Test 2 after the complete Test 1 is finished, the complete test time for the two tests can be reduced and therefore a test throughput can be increased.

Figure 4:
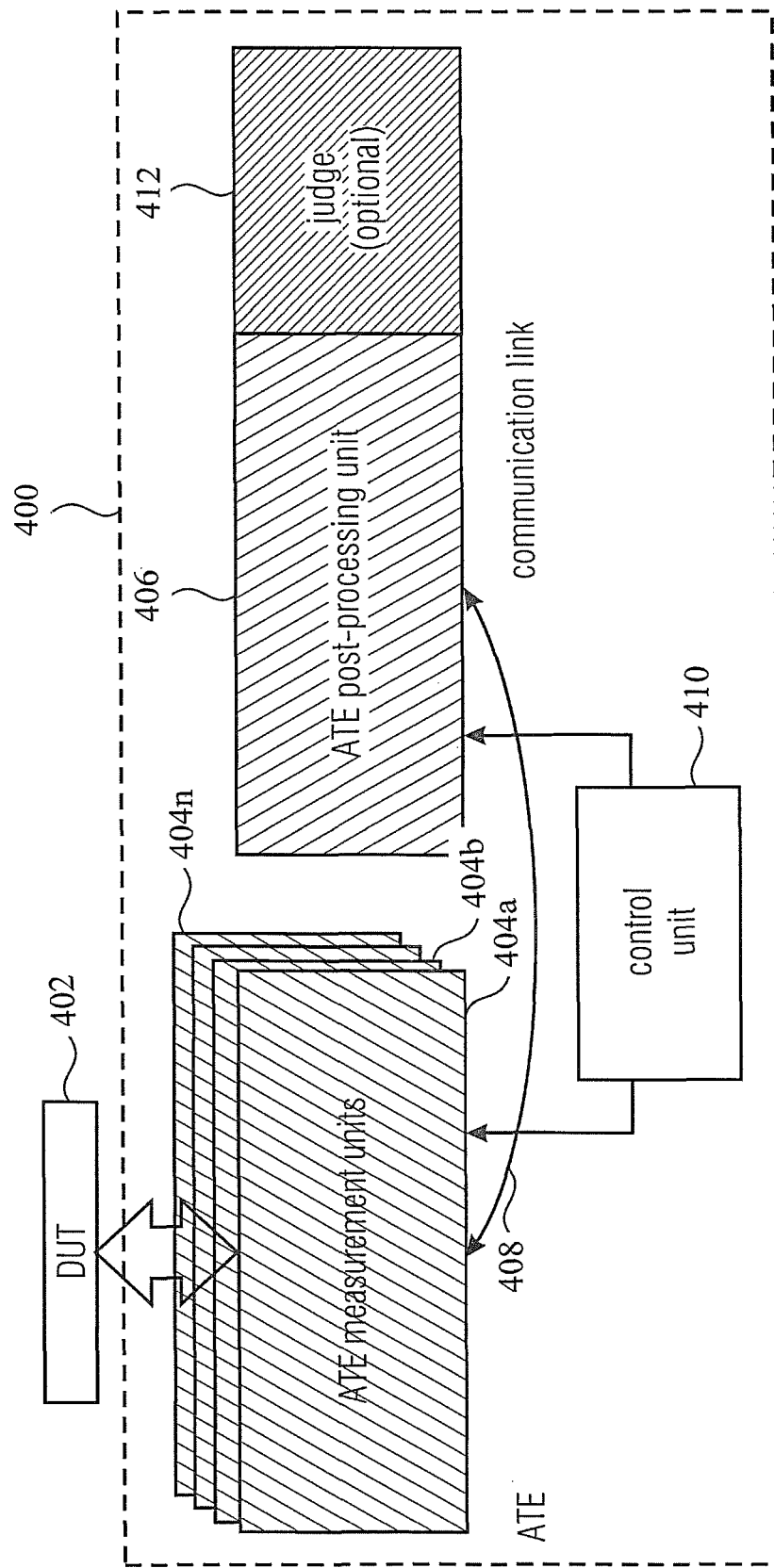
FIG. 4 illustrates an exemplary simplified block diagram of an exemplary automatic test equipment in accordance with an embodiment of the present invention.

FIG. 4 illustrates an exemplary schematic block diagram of automatic test equipment 400. The automatic test equipment 400 can be coupled to a device under test 402 to perform a variety of tests on the device under test 402. The automatic test equipment 400 comprises one or more measurement units 404a to 404n (also designated as ATE measurement units). Furthermore, the automatic tests equipment 400 comprises a post-processing unit 406 (also designated as an ATE post-processing unit). Furthermore, the automatic test equipment comprises a communication link 408 connecting the measurement units 404a to 404n and the post-processing unit 406. The automatic test equipment 400 also comprises a control unit 410. Each test performed by the automatic test equipment 400 comprises a foreground process comprising a setup procedure during which a desired test mode is set, and a background process comprising an upload procedure during which data captured from the device under test 402 is provided. The communication link 408 is shared by the foreground process and the background process. The control unit 410 may be configured to execute the foreground process with a higher priority than the background process, thereby minimizing a delay between the start of consecutive tests performed on the device under test 402. The control unit 410 may be configured to control the measurement units 404a to 404n, the communication link 408, and the post processing unit 406.

According to further embodiments, the control unit 410 may be part of the post processing unit 406. Such an implementation may be simpler to implement and much cheaper to upgrade than the conventional methods. Especially for low cost automatic test equipment, the integration of the control unit 410 in the post processing unit 406 has an economical advantage while still providing optimized throughput.

According to further embodiments, the post processing unit 406 may be part of a (commercial) personal computer, e.g. comprising a multi core CPU. Furthermore, the control unit 410 may be part of this personal computer. As an example, the automatic test equipment 400 may perform Test 1 and Test 2 as illustrated in FIG. 3.

As an example, during the setup procedure of Test 1 a first ATE measurement unit 404a and the device under test 402 are set into the desired test mode, for example, by the control unit 410 using the communication link 408. During the upload procedure of Test 1, data captured from the device under test 402 is uploaded from the first ATE measurement unit 404a to the post-processing unit 406 using the communication link 408. Therefore, the communication link 408 is used for both procedures of Test 1, namely for the setup procedure and the upload procedure. This may apply for all tests performed by the automatic test equipment 400. Furthermore, Test 2 can be started after Test 1 has finished its setup procedure, for Test 2, a second measurement unit 404b and the device 402 may be set into the desired test mode (e.g. by the control unit 410) using the communication link 408.

As illustrated in FIG. 3, the upload procedure for Test 1 may run parallel to the setup procedure for Test 2, the parallel running of these two procedures of the different tests is enabled by having different priorities for the setup procedure of Test 2 (as a foreground process) and of the upload procedure of Test 1 (as a background process). Hence, the upload procedure (as a background process) of Test 1 can be halted by the control unit 410 when the setup procedure (as a foreground process) of Test 2 needs the communication link 408, and can be continued when the setup procedure of Test 2 does not need the communication link 408 anymore. Hence, with the automatic test equipment 400, a plurality of tests can be performed on the device under test 402, wherein at least one test runs one of its procedures as a background process.

As discussed herein, the automatic test equipment 400 may be configured such that during the setup procedure of a test, the one or more measurement units 404a to 404n and the device under test 402 are set into the desired test mode, and during the upload procedure, data captured from the device under test 402 is provided to the post-processing unit 406.

According to further embodiments, the automatic test equipment 400 may comprise an optional judge unit 412 for judging if a result of the test performed on the device under test 402 is within a specification for the device under test 402. The judge unit may be comprised in the post processing unit 406.

Figure 5A:
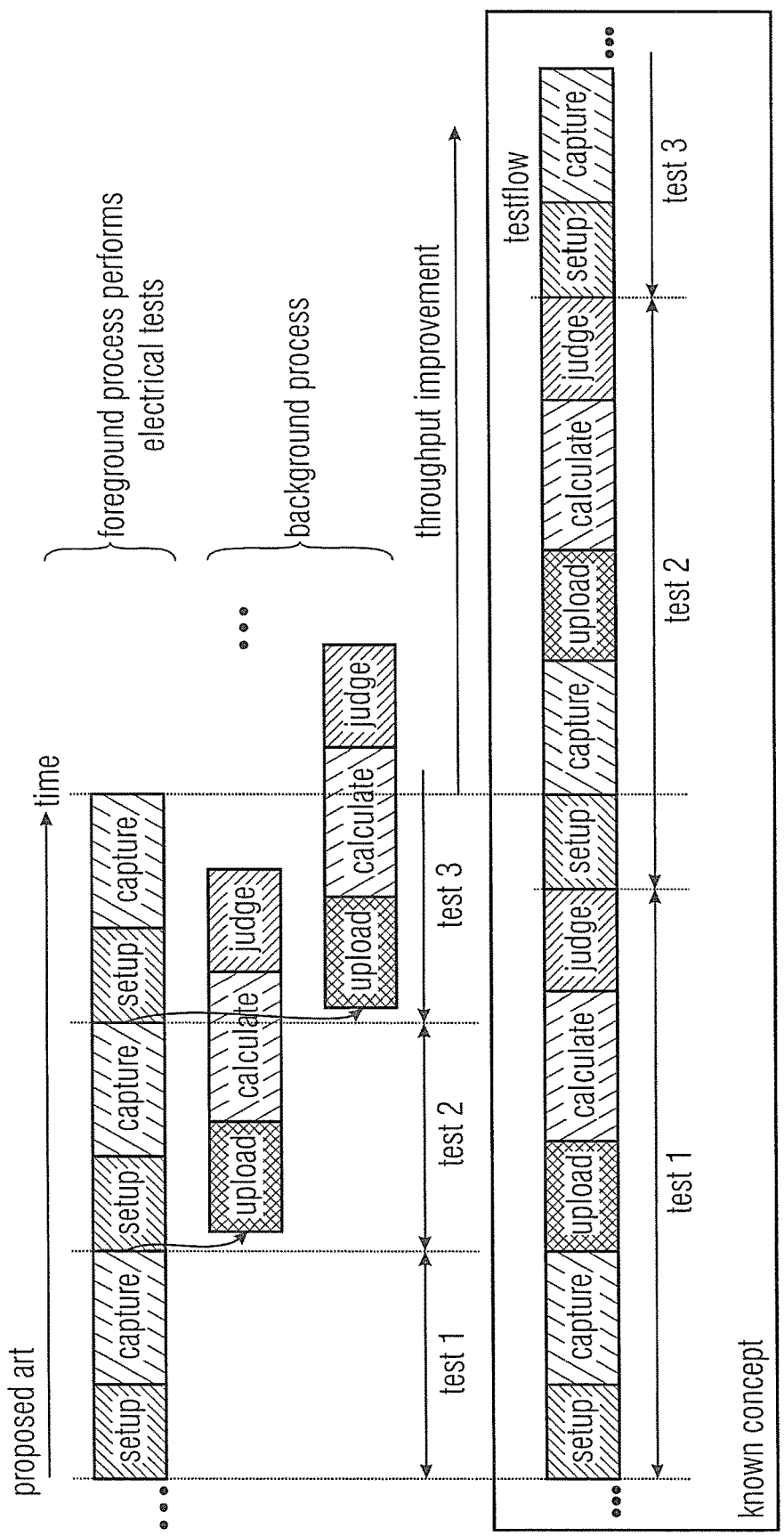
FIG. 5A illustrates a comparison between an exemplary method for performing a plurality of tests according to one embodiment of the present disclosure and a conventional method for performing the plurality of tests.

FIG. 5A illustrates a comparison between the performance of a plurality of tests using an exemplary method, and the performance of a plurality of tests according to a conventional method. As illustrated in FIG. 5A, a test can comprise additional processes. FIG. 5A illustrates that foreground processes of the tests may comprise a setup procedure and a capture procedure, while background processes of the tests may comprise an upload procedure, a calculate procedure, and a judge procedure (or judgment procedure).

The judge procedure basically determines whether a specific test result is within its tests limits (according to device specification). In some embodiments a judge or judgment procedure may also be known as an evaluation or analysis procedure. In some cases a logging may be needed. In one exemplary embodiment, background processes may comprise an optional logging procedure. The logging may happen to a terminal like screen or a file.

As illustrated in FIG. 5A, a next test may be started as soon as a setup and capture process (in a foreground process) of a preceding test have finished (with an upload and a calculation/judge process to be performed in a background process). This may provide a clear throughput improvement. Although the communication link 408 may be a shared resource, communication between foreground procedures (setup and capture) and background procedures (upload, calculation and judge) may not impact test time in the critical path (for example, the foreground processes).

The foreground processes may perform electrical tests on the device under test, for example, in the capture procedure. During this capture procedure a measurement unit, which has been set into a desired setup mode by the preceding setup procedure, captures the data from the device under test 402, which is then uploaded to the post-processing unit 406. A capture (procedure) represents the actual measurement with the ATE measurement units 404a-404n, and may comprise just a simple response bit or large DUT response arrays to be post-processed. The post-processing unit 406 calculates a result based on the uploaded data. The judge unit 412 may then judge whether the calculated result is within device under test specifications.

Embodiments of the invention may take advantage of today's multithreading CPUs and their use as an ATE post-processing unit. The capture upload, calculation and judge are encapsulated in a self-contained coding unit and executed in a separate background process or thread. While calculation and judge processes can be run in parallel to any other process, the upload needs to be controlled via the foreground due to the shared resource.

Some embodiments may split up the upload into multiple smaller segments. This allows an upload process to be quickly halted should a foreground process need to take over control of the shared resource (e.g., to continue with the next test) and to be resumed at a later point of time. Foreground may not be slowed down by upload. The upload may be triggered by the foreground process during situations when there is no communication between post-processing and measurement units, and the measurement unit is working in a self-sustainable mode, e.g., during a device settling time or capture time. Before a new capture data segment is uploaded, the background threads evaluate whether the measurement unit is still operating in this particular mode. Otherwise a data upload process will halt other operations to start. Or, in other words, whenever a segmented background execution is finished, it is checked (e.g., by the control unit 410) whether the foreground process needs the shared communication link 408, and if not, the next segmented background execution may be started (when necessitated).

According to further embodiments, the control unit 410 can determine when the communication link 410 is available and for how long (e.g. with a training run, calculation or similar) it is available. Based on this information, the control unit 410 may split up the upload process of the background process (e.g. into segments fitting into time windows, during which the communication link 408 is available).

According to further embodiments, the foreground process and the background process may have fixed time slots (time multiplexing), where they can access the shared communication link 408. The foreground process may have larger slots than the background process.

According to further embodiments, whenever the foreground process needs the shared resource (the communication link 408), the foreground process can immediately interrupt the background process, which can be resumed later on. In other words, the control unit 410 may implement an interrupt functionality, in which the foreground process has a higher priority than the background process. The control unit 410 may be configured to interrupt the background process when the foreground process needs the communication link 408, and may resume the background process when the foreground process no longer needs the communication link 408.

As an example, Test 1 may run on the first measurement unit 404a. After capturing the data from the device under test 402, Test 1 switches from the foreground process to the background process for uploading the captured data from the device under test 402 to the post-processing unit 406. The control unit 410 may now also start Test 2 by setting up the second measurement unit 404b and the device under Test 402, using the communication link 408. Due to the higher priority of the foreground process of Test 2, the control unit 410 may pause the upload procedure of Test 1 until the communication link 408 is not needed anymore by the setup process for the second ATE measurement unit 404b. The control unit 410 may resume the upload of the data captured in Test 1 when no communication through the communication link 408 is needed for the foreground process of Test 2.

FIG. 5A illustrates that once the test data is captured, a background process (for uploading, calculating and judging the test data) may be called, and the flow can continue with the next test (for example, Test 2) and the next capture (of Test 2). The background process (also designated as a background thread) independently handles the uploads and the calculations.

In one exemplary embodiment, a measurement unit (e.g. the first measurement unit 404a) may be configured so that it does not need the communication link 408 during the capture process, such that during the capture process, the measurement unit only communicates with the device under test 402. Therefore, during the capture process the communication link 408 is available and can be used for the background processes, for example, for uploading captured data from another measurement unit to the post-processing unit 406.

In one exemplary embodiment, each test is written as a single entity (self-contained) to ensure proper code development. FIG. 5B illustrates a self-contained pseudo code example for a test performed by the automatic test equipment 400. The setup and capture procedure may be run in a foreground process, for example, with a high priority, and the upload, calculate, and judge processes to be run in a background process with a lower priority. A plurality of background processes of a plurality of tests may run in parallel with one foreground process of another test.

As discussed herein, the background process covers exemplary upload processes, calculation processes, and judgment processes, while the foreground process covers setup processes and capture processes. As illustrated in FIGS. 5A and 5B, the foreground process may trigger and halt a background upload process. According to further embodiments, alternative communication methods are possible, such as prioritized interrupts (e.g. generated by the foreground process) or time-sliced communications. In other words, the background process can be controlled by the foreground process, such that the upload process of the background process starts or halts dependent upon the availability of the communication link. The communication link is typically available when it is not necessitated by the foreground process.

The upload procedure can be divided into a plurality of segments. By dividing the upload procedure into a plurality of segments, the upload process can be stopped and resumed easily. The upload process for one test can be executed during the capture process of one or more tests following the one test.

According to further embodiments, the calculation process and the judge process may be executed by one or more threads provided in the post-processing unit. In one embodiment, the judge unit 412 may be part of the post-processing unit 406. As an example, the post-processing unit 406 may comprise a processor, for example, a multi-core processor. Therefore, embodiments with a multi-core processor may calculate several threads in parallel. As illustrated in FIG. 5A, the background processes of Test 1 and Test 2 may run in parallel. For example, the calculate process and judge process of Test 2 may run in parallel together with the calculate process and judge process of Test 1 on different threads, and therefore, may be performed by different cores of the processor, as the shared resource (the communication link 408) is not needed for the calculation process and judge process.

To summarize, the measurement units 404a to 404n are configured to execute the capture procedure and the post-processing unit 406 (comprising a judge unit 412) is configured to execute the calculation procedure and the judge procedure, for example, of two or more tests in parallel. The scheduling of these calculation and judge processes may be handled by the control unit 410. Furthermore, the calculate and judge processes of several tests may run in parallel, for example, without interruption of a setup process and a capture process of another test, since the calculate and judge processes do not need the communication link 408.

Figure 6B:
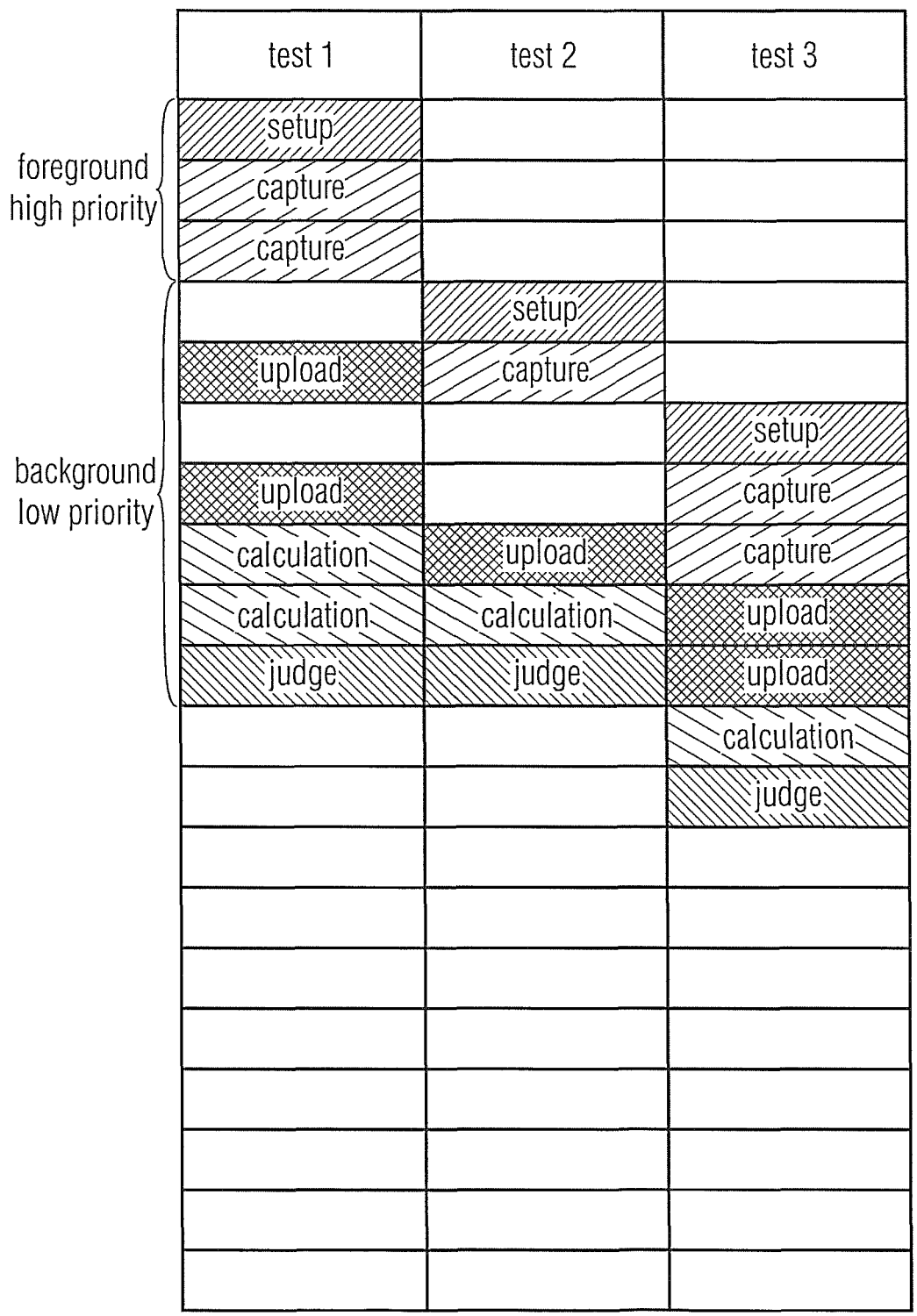
FIG. 6B illustrates how the tests illustrated in FIG. 4A may be performed in accordance with an embodiment of the present invention.

FIG. 6A illustrates an exemplary test execution flowchart representing a conventional approach operating serially. FIG. 6B illustrates an exemplary test execution flowchart for the same test in FIG. 6A, in accordance with an embodiment of the present invention. As illustrated in FIG. 6B, Test 1 kicks-off a background thread after its capture process is finished. Furthermore, Test 2 starts with its foreground process (in detail with the setup process). The setup process uses the communication link 408, therefore the upload process of Test 1 is paused. The capture process of Test 2 triggers the upload process of Test 1, and halts it as soon as the capture process is finished. During the capture process, typically the communication link 408 is not used; therefore, it is free for the upload process of Test 1. After the capture process of Test 2, Test 2 starts its background process. Furthermore, Test 3 starts its foreground process (in detail its setup process), such that the upload processes of Test 1 and Test 2 are paused. Upon finishing the setup process of Test 3, Test 1 resumes its upload process, as the communication link 408 is not used by any foreground process (capture process of Test 3 does not need the communication link). In other words, the capture process of Test 3 triggers the upload process of Test 1 to finish and kicks-off the upload process of Test 2. The upload process of Test 2 starts after the upload process of Test 1, because during the upload process of Test 1, the communication link 408 is used by the upload process of Test 1. The calculation and judge processes of the three tests can run in parallel, since they are not limited by the communication link.

By comparing FIGS. 6A and 6B, it will become clear that a total test time for the three tests can be reduced dramatically, and therefore a test throughput may be increased with embodiments of the present invention.

According to further embodiments, the upload process of Test 1 may run during the setup process of Test 2, as during the setup process of Test 2, periods in time may exist, during which the shared communication link is not used by the setup process. According to further embodiments, the upload process of Test 1 may start before the capture process of Test 1 finishes, such that already captured data is uploaded, while new data is captured (during one and the same Test). In other words, the application could add an additional statement that the upload process (or in general the background process) may also perform during the setup process (e.g. device setup may necessitate a long settling time, which can be used without overall performance impact, since the communication link is not used during the settling time) or capture (e.g. capture is large and since measurement units may feature a dual port memory and multiple capture banks, it could start uploading of already finished smaller blocks).

Embodiments of the present invention have several advantages. No additional hardware link is necessitated to allow parallel data upload and ATE measurement unit control. No protocol changes on the communication link are necessitated to allow parallel data upload and ATE measurement unit control. The simple implementation allows clear performance improvement (test time reduction) as illustrated in FIGS. 6A and 6B. Embodiments of the present invention allow performance improvements without changing any hardware in the ATE measurement or the post-processing unit and are therefore applicable to any ATE platform. A further advantage is that the coding model in the test flow execution engine stays self-contained.

Exemplary embodiments take advantage of the multi-core processor trend in the consumer market. Single consumer workstations can take over control of an ATE measurement unit as well as perform parallel (in case multiple DUTs are tested at the same time) post-processing without loss of performance.

Thus, embodiments of the invention provide an ATE that allows the user to define setup, capture, upload, calculation and judge processes in one self-contained entity, and partitions execution in the presence of a shared communication link in such a way that the critical foreground process is optimized. Further embodiments of the invention provide an ATE that encapsulates and performs an upload of captured data in a background thread via a shared communication link between an ATE measurement unit and a post-processing unit. Further embodiments of the invention provide an ATE that encapsulates and performs an upload of captured data in a background thread via a shared communication link between an ATE measurement unit and a post-processing unit and dividing the upload burst in multiple segments.

Further embodiments of the invention provide an ATE that encapsulates and performs capture data upload, result calculation and judge in a single background thread, while performing upload via a shared communication link between an ATE measurement unit and a post-processing unit. Further embodiments of the invention provide an ATE that controls the capture data upload, which runs on a background thread via a shared communication link, from the foreground, allowing the starting or halting of an upload dependent on availability of the communication link between the ATE measurement unit and the post-processing unit. Embodiments of the present invention allow data from a measurement to be uploaded from a measurement unit to a post-processing unit while other tests are being performed.

The control unit 410 controls the upload of the digital or analog data from the measurement unit 404a to 404n to the post-processing unit 406 to avoid any impact on test time, e.g. it automatically triggers the upload whenever certain procedures are executed in parallel (for example, when a capture process and/or a calculation process and/or a judge process of another test are active at the same time). When the execution time of such a single process running in parallel to the upload process is not sufficient, the upload process may span over multiple such parallel process. This is possible because the upload process can be performed in small segments. The upload process in the background will automatically pause when such a parallel process is finished and seamlessly continues with the next, besides the next process is a setup process, needing the communication link 408. As soon as the upload process is done, the calculation process will continue regardless of what happens in the foreground process. As the upload process of a test can be paused when another test performs a setup process, the measurement units 404a to 404n may comprise a memory for storing the data captured from the device under test 402, at least until the captured data is completely uploaded to the post-processing unit 406.

According to further embodiments, the control unit 410 may trigger a waiting upload process of a test whenever it does not affect the throughput of the main test flow (of the running foreground process). As soon as the (serial) upload thread or upload process is finished, the calculation thread or process continues in parallel on different CPU cores. According to further embodiments the calculation process and the judge process of two or more tests run in parallel on different threads, e.g. on different CPU cores of a CPU of the post processing unit 406.

Although some aspects have been described in the context of an apparatus, it is clear that these aspects also represent a description of the corresponding method, where a block or device corresponds to a method process or a feature of a method process. Analogously, aspects described in the context of a method process also represent a description of a corresponding block or item or feature of a corresponding apparatus. Some or all of the method processes may be executed by (or using) a hardware apparatus, like for example, a microprocessor, a programmable computer or an electronic circuit. In some embodiments, some one or more of the most important method processes may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments may comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier. Other embodiments comprise the computer program for performing one of the methods described herein, stored on a machine readable carrier. In other words, in one exemplary embodiment, a computer program has program code for performing one of the methods described herein, when the computer program runs on a computer.

In one exemplary embodiment, a data carrier (or a digital storage medium, or a computer-readable medium) comprises, recorded thereon, a computer program for performing one of the methods described herein. The data carrier, the digital storage medium or the recorded medium are typically tangible and/or non-transitory. A further embodiment of the inventive method is, therefore, a data stream or a sequence of signals representing the computer program for performing one of the methods described herein. The data stream or the sequence of signals may for example be configured to be transferred via a data communication connection, for example via the Internet. A further embodiment comprises a processing means, for example a computer, or a programmable logic device, configured to or adapted to perform one of the methods described herein. A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for performing a plurality of tests on a device under test, the method comprising:
performing a plurality of tests on a device under test, wherein each test of the plurality of tests comprises:
a foreground process comprising a setup process during which a requested test mode is set; and
a background process comprising an upload process during which data captured from the device under test is provided, wherein the foreground process is executed with a higher priority than the background process which reduces a delay between a start of consecutive tests of the device under test, wherein during the setup process one or more measurement units of automatic test equipment and the device under test are set into the desired test mode and during the upload process data captured from the device under test is provided to the automatic test equipment.

2. The method of claim 1, wherein during the upload process data captured from the device under test is provided to a post-processing unit of the automatic test equipment.

3. The method of claim 2, wherein the one or more measurement units of the automatic test equipment and the post-processing unit of the automatic test equipment are connected by a communication link shared by the foreground process and the background process.

4. The method of claim 3, wherein the background process is controlled by the foreground process, wherein the upload process of the background process starts or halts dependent from the availability of the communication link, and wherein the communication link is available when it is not necessitated by the foreground process.

5. The method of claim 1, wherein the upload process is divided into a plurality of segments.

6. The method of claim 1, wherein the foreground process further comprises a capture process during which data from the device under test is captured, and wherein the background process further comprises a calculation process during which a test result is calculated on the basis of the data uploaded.

7. The method of claim 6, wherein the background process further comprises a judgment process during which the result of the calculation process is evaluated.

8. The method of claim 7, wherein the calculation process and the judgment process are executed by one or more threads provided in a post-processing unit.

9. The method of claim 6, wherein the upload process for one test is executed during the capture process of one or more tests following the one test.

10. The method of claim 9, wherein the calculation process and the judgment process of two or more tests run in parallel.

11. A non-transitory computer readable medium comprising program code for executing a method for performing a plurality of tests on a device under test, the method comprising:
performing a plurality of tests on a device under test, wherein each test of the plurality of tests comprises:
performing a foreground process comprising a setup process during which a requested test mode is set; and
performing a background process comprising an upload process during which data captured from the device under test is provided, wherein the foreground process is executed with a higher priority than the background process which reduces a delay between a start of consecutive tests of the device under test, wherein during the setup process one or more measurement units of automatic test equipment and the device under test are set into the desired test mode and during the upload process data captured from the device under test is provided to the automatic test equipment.

12. An automatic test equipment operable to perform a plurality of tests on a device under test, wherein the automatic test equipment comprises:
one or more measurement units;
a post-processing unit;
a communication link coupling the one or more measurement units and the post-processing unit; and
a control unit, wherein each test comprises a foreground process comprising a setup process during which a requested test mode is set, and a background process comprising an upload process during which data captured from the device under test is provided, wherein the communication link is operable to be shared by the foreground process and the background process, and wherein the control unit is configured to execute the foreground process with a higher priority than the background process which reduces a delay between the start of consecutive tests of the device under test, wherein during the setup process the one or more measurement units and the device under test are set into the desired test mode and during the upload process data captured from the device under test is provided to the post-processing unit.

13. The automatic test equipment of claim 12, wherein the control unit is configured to control the background process, wherein the upload process of the background process starts or halts dependent from the availability of the communication link, and wherein the communication link is available when it is not necessitated by the foreground process.

14. The automatic test equipment of claim 12, wherein the foreground process further comprises a capture process during which data from the device under test is captured, and wherein the background process further comprises a calculation process during which a test result is calculated on the basis of the data uploaded.

15. The automatic test equipment of claim 14, wherein the background process further comprises a judgment process during which the result of the calculation is evaluated.

16. The automatic test equipment of claim 15, wherein the calculation process and the judgment process are executed by one or more threads provided in the post-processing unit.

17. The automatic test equipment of claim 14, wherein the control unit is configured to execute the upload process for one test during the capture process of one or more tests following the one test.

18. The automatic test equipment of claim 15, wherein the post-processing unit is configured to run the calculation process and the judgment process of two or more tests in parallel.

19. The automatic test equipment of claim 12, wherein the control unit is configured to divide the upload process into a plurality of segments, to check if the foreground process necessitates the communication link and to start an upload of a segment of the plurality of segments, if the communication link is not needed by the foreground process.

20. The automatic test equipment of claim 12, wherein the control unit is configured to determine when the communication link is not necessitated by the foreground process, and for a period the communication link is not necessitated by the foreground process.

21. The automatic test equipment of claim 12, wherein the foreground process and the background comprise fixed time slots, during which they can access the communication link, and wherein time slots of the foreground process are larger than time slots of the background process.

22. The automatic test equipment of claim 12, wherein the control unit is configured to interrupt the background process when the communication link is necessitated by the foreground process, and to resume the background process, when the foreground process does not necessitate the communication link anymore.

23. The automatic test equipment of claim 12, wherein the post processing unit comprises a multi-core processor.

24. The automatic test equipment of claim 12, wherein the post processing unit is part of a personal computer.

* * * * *